US010535988B2

(12) United States Patent
Hrncir et al.

(10) Patent No.: US 10,535,988 B2
(45) Date of Patent: Jan. 14, 2020

(54) ARC FLASH DETECTION APPARATUS AND ELECTRICAL SYSTEM INCLUDING THE SAME

(71) Applicant: EATON CORPORATION, Cleveland, OH (US)

(72) Inventors: Daniel Edward Hrncir, Arden, NC (US); Robert Judson Burns, Hendersonville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 321 days.

(21) Appl. No.: 15/668,382

(22) Filed: Aug. 3, 2017

(65) Prior Publication Data

US 2019/0044316 A1  Feb. 7, 2019

(51) Int. Cl.
| | | |
|---|---|---|
| H02H 3/00 | (2006.01) | |
| H02H 1/00 | (2006.01) | |
| H02H 7/22 | (2006.01) | |
| H03K 19/003 | (2006.01) | |
| H02H 7/26 | (2006.01) | |

(52) U.S. Cl.
CPC .......... *H02H 1/0023* (2013.01); *H02H 3/006* (2013.01); *H02H 7/22* (2013.01); *H03K 19/003* (2013.01); *H02H 7/262* (2013.01)

(58) Field of Classification Search
None
See application file for complete search history.

(56) References Cited

U.S. PATENT DOCUMENTS

| | | | |
|---|---|---|---|
| 8,228,652 B2 | 7/2012 | Yanniello | |
| 8,390,966 B2 | 3/2013 | Dahl et al. | |
| 8,861,144 B2 * | 10/2014 | Shea | H01T 2/02 361/117 |
| 8,964,344 B2 | 2/2015 | Spangenberg et al. | |
| 9,325,167 B2 | 4/2016 | Kumfer et al. | |
| 9,407,082 B2 * | 8/2016 | Lagree | H02H 3/08 |

(Continued)

OTHER PUBLICATIONS

Ariana Amberg, "Applying Arc-Flash Detection With Air-Magnetic Circuit Breakers", Schweitzer Engineering Laboratories, Inc., pp. 1-3.

(Continued)

*Primary Examiner* — Stephen W Jackson
(74) *Attorney, Agent, or Firm* — Eckert Seamans Cherin & Mellott, LLC

(57) ABSTRACT

An electrical system includes first, second and third busses; a first interrupter electrically connected between the first and second busses; at least one of a shorting apparatus operatively associated with the first or second bus, and the first interrupter comprising a trip coil; a current sensor to sense a fault current flowing in the first bus and responsively output a first signal; a number of light sensors to sense an arc flash operatively associated with a number of the first, second or third busses and responsively output a second signal; a second interrupter electrically connected between the second and third power busses and output a third signal; and a circuit to invert the third signal to provide a fourth signal, and to operate the at least one of the shorting apparatus and the trip coil responsive to an AND of the first, second and fourth signals.

14 Claims, 3 Drawing Sheets

(56) References Cited

U.S. PATENT DOCUMENTS

2014/0043714 A1\* 2/2014 Benke ................. H02H 1/0023
　　　　　　　　　　　　　　　　　　　　　　361/42
2014/0192458 A1　 7/2014 Valdes

OTHER PUBLICATIONS

European Patent Office, "International Search Report and Written Opinion" from related International application, PCT/IB18/055877, dated Jan. 18, 2019, 11 pp.

\* cited by examiner

ARC FLASH DETECTION APPARATUS AND ELECTRICAL SYSTEM INCLUDING THE SAME

BACKGROUND

Field

The disclosed concept pertains generally to electrical systems and, more particularly, to electrical power systems that are subject to arc flashes. The disclosed concept also pertains to arc flash detection apparatus.

Background Information

Electric power systems incorporate switches for control and protection purposes. Distribution systems, which form part of the overall electric power system, include main and feeder power buses and circuit breakers mounted in metal cabinets to form switchgear. Interruption of current flow in the buses of the distribution system by a circuit breaker creates an arc as the contacts of the circuit breaker open. These arcs caused by interruption are generally contained and extinguished in the normal course of operation of the circuit breaker.

At times, however, unintended arcing faults can occur within switchgear cabinets, such as between power buses, or between a power bus and a grounded metal component. Such arcing faults can produce high energy gases, which pose a threat to the structure and nearby personnel. This is especially true when maintenance is performed on or about live power circuits. For example, a worker might inadvertently short out the power bus, thereby creating an arcing fault inside the enclosure. The resulting arc blast creates an extreme hazard and could cause injury or even death. This problem is exacerbated by the fact that the enclosure doors are typically open for maintenance.

A common approach to protecting personnel from arcing faults in switchgear has been to design the metal enclosures to withstand the blast from the arcing fault. This has been done at great additional costs due to the heavy gauge metal used and numerous weld joints needed to prevent flying debris. Even with these precautions, the blast from an arcing fault inside the switchgear may not be contained.

Various known methods seek to minimize the severity of the blast from an internal arcing fault. These methods include pressure sensing and light detection, which sense the arcing fault within the switchgear and cause a circuit breaker to trip before significant damage can result. The pressure sensing method is limited by the insensitivity of the pressure sensors. By the time cabinet pressure has risen to detectable levels, the arcing fault has already caused significant damage.

In an electrical system, an internal arcing fault can occur somewhere inside of the switchgear enclosure, frequently, but certainly not limited to the point where the power cables servicing the load are connected.

In an electrical system, such as, for example, a motor control center, an internal arcing fault could occur within the load center panelboard when, for example, servicing line panelboards. A bare live copper bus could inadvertently be shorted. Another example for both low and medium voltage systems would be the shorting of power conductors by rodents, snakes, or other animals or objects.

In the low voltage system, the arcing fault could clear itself, by burning or ejecting the short, but it may take more than one-half cycle to do so, thereby causing significant damage and great risk of injury to workers even in one-half cycle of arcing.

A medium voltage system could behave similar to a low voltage system; however, the medium voltage system would be less likely to be self-extinguishing.

It is known to employ a high-speed shorting switch to eliminate an arcing fault. Known arc elimination devices and systems produce a bolted fault across the power bus (e.g., phase-to-phase, such as two switches for three phases; phase-to-ground, such as three switches for three phases), in order to eliminate the arcing fault and prevent equipment damage and personnel injury due to arc blasts. It is also known to employ various types of crowbar switches for this purpose. The resulting short on the power bus causes an upstream circuit breaker to clear the bolted fault by removing power. See, for example, U.S. Pat. Nos. 7,145,757; 7,035,068; 6,839,209; 6,724,604; 6,693,438; 6,657,150; and 6,633,009. As a result, system power is lost due to the tripping of the upstream circuit breaker. Once the arc is out, and if the short has been burned away or removed, then system power can be restored.

Arc flash light detection systems can employ only the light produced by arcing internal to electrical equipment (see, for example, U.S. Pat. No. 6,229,680), or can sense a combination of light and relatively high current. The addition of current sensing is intended to avoid nuisance operation for normal light sources (e.g., a camera flash; a flashlight). Protective devices, such as air circuit breakers (i.e., circuit breakers that interrupt current in air), produce arc bi-products during normal operation, such as, for example, copper vapor in the arc plasma exhausted from a circuit breaker's arc chute. Since such protective devices also operate during relatively high current conditions, the normal operation of these protective devices with an open arc chamber produces challenges when attempting to protect such devices against the condition of internal arcing, yet also make them immune to the normal arcing such devices produce during relatively high current protection conditions. U.S. Pat. No. 8,228,652 describes an approach which utilizes a delay circuit to try to avoid nuisance operation due to arcs emanating from an open circuit interrupter. While such approach addresses some nuisance operation, there is still room for improvement in electrical systems for differentiating between arcs due to an internal fault versus arcs emanating from an open circuit interrupter.

There is also room for improvement in arc flash detection apparatus.

SUMMARY

These needs and others are met by embodiments of the disclosed concept, which are directed to an arc flash detection apparatus and an electrical system including an arc flash detection apparatus.

As one aspect of the disclosed concept, an electrical system is provided. The electrical system comprises: a first power bus; a second power bus; a third power bus; a first circuit interrupter electrically connected between the first power bus and the second power bus; at least one of: (a) a shorting apparatus operatively associated with the first power bus or second power bus, and (b) the first circuit interrupter comprising a trip coil; a current sensor structured to sense a fault current of at least a predetermined magnitude flowing in the first power bus and responsively output a first logical signal; a number of light sensors structured to sense an arc flash operatively associated with a number of the first power bus, second power bus and the third power bus and responsively output a second logical signal; a second circuit interrupter electrically connected between the second power bus and the third power bus, the second circuit interrupter being structured to move from a closed position to an open position responsive to detecting an overcurrent condition and responsively output a third logical signal; and a circuit structured invert the third logical signal to provide a fourth logical signal, and to operate the at least one of the shorting apparatus and the trip coil responsive to a logical AND of the first logical signal, the second logical signal and the fourth logical signal.

The current sensor may be structured to sense the fault current and output the first logical signal when the sensed fault current exceeds a predetermined magnitude.

The second circuit interrupter may comprise a protective relay and the third logical signal may originate from the protective relay.

The second circuit interrupter may comprise an auxiliary contact and the third logical signal may originate from the auxiliary contact.

The second circuit interrupter may comprise a trip shaft and the third logical signal may be produced by a device monitoring the trip shaft.

The circuit may comprise a three-input AND gate structured to provide the logical AND of the first logical signal, the second logical signal and the fourth logical signal, and an output to operate the at least one of the shorting apparatus and the trip coil.

The electrical system may be disposed within a housing; wherein the third power bus extends out of the housing; and wherein the circuit is structured to operate the shorting apparatus for a fault on the second power bus and for a fault on the third power bus occurring within the housing but is structured to not operate the shorting apparatus for a fault on the third power bus occurring outside of the housing or for an arc generated by the second current interrupter when protecting against the fault on the third power bus occurring outside of the housing.

The circuit may comprise an arc detection relay.

As another aspect of the disclosed concept, an arc flash detection apparatus for an electrical system comprises a first power bus, a second power bus, a third power bus, a first circuit interrupter electrically connected between the first power bus and the second power bus, a second circuit interrupter electrically connected between the second power bus and the third power bus, the second circuit interrupter being structured to move from a closed position to an open position responsive to detecting an overcurrent condition and responsively output a third logical signal, and at least one of: (a) a shorting apparatus operatively associated with the second power bus, and (b) the first circuit interrupter comprising a trip coil, is provided. The arc flash detection apparatus comprises: a current sensor structured to sense a fault current of at least a predetermined magnitude flowing in the second power bus and responsively output a first logical signal; a number of light sensors structured to sense an arc flash operatively associated with a number of the second power bus and the third power bus and responsively output a second logical signal; a second circuit interrupter electrically connected between the second power bus and the third power bus, the second circuit interrupter being structured to move from a closed position to an open position responsive to detecting an overcurrent condition and responsively output a third logical signal; and a circuit structured to invert the third logical signal to provide a fourth logical signal, and to operate the at least one of the shorting apparatus and the trip coil responsive to a logical AND of the first logical signal, the second logical signal and the fourth logical signal.

The current sensor may be structured to output the first logical signal when the sensed fault current exceeds a predetermined magnitude.

The circuit may comprise a three-input AND gate structured to provide the logical AND of the first logical signal, the second logical signal and the fourth logical signal, and an output to operate the at least one of the shorting apparatus and the trip coil.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

Figure 1:
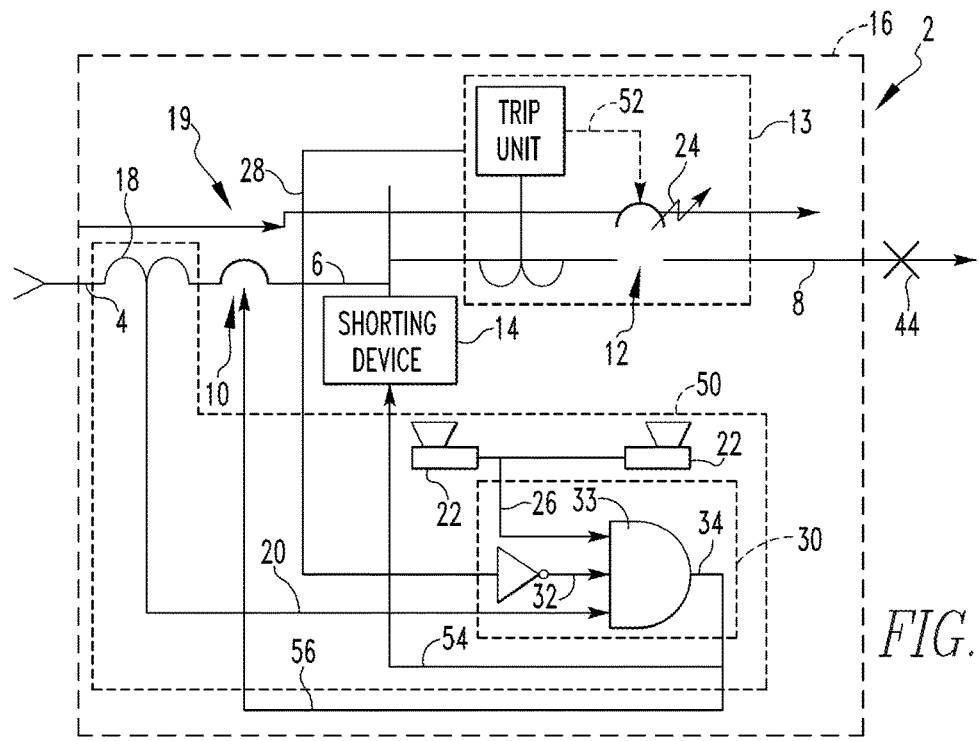
FIG. 1 is a block diagram in schematic form of an arc flash detection apparatus for use with switchgear comprising source service, main and feeder load side power buses, main and feeder circuit breakers, and a shorting device on the main power bus, with a fault outside of the equipment housing on the feeder load side power bus in accordance with an embodiment of the disclosed concept.

Referring to FIG. 1, an electrical system 2 in accordance with an example embodiment of the disclosed concept includes a first power bus 4 (e.g., without limitation, a source service power bus), a second power bus 6 (e.g., without limitation, a main power bus) and a third power bus 8 (e.g., without limitation, a feeder load side power bus). A first circuit interrupter 10 (e.g., without limitation, a main circuit breaker) is electrically connected between the first and second power busses 4,6 such that the second power bus 6 is electrically isolated from the first power bus 4 when the first circuit interrupter 10 is disposed in an "open" position (conversely, the first and second power busses 4,6 are electrically connected when the first circuit interrupter 10 is disposed in a "closed" position). A second circuit interrupter 12 (e.g., without limitation, a feeder circuit breaker) provided in a housing 13 is electrically connected between the second and third power busses 6,8 such that the third power bus 8 is electrically isolated from the second power bus 6 when the second circuit interrupter 12 is disposed in an "open" position (conversely, the second and third power busses 6,8 are electrically connected when the second circuit interrupter 12 is disposed in a "closed" position). Although both are shown in the example of FIG. 1, the electrical system 2 can include one or both of a shorting apparatus, such as shorting device 14, operatively associated with the second power bus 6, and a trip coil, such as a shunt trip coil (not shown) of the first circuit interrupter 10. It will be appreciated that the first circuit interrupter 10 can be part of an electrical enclosure 16 for the second power bus 6 and the second circuit interrupter 12, or can be part of a separate assembly (not shown).

The example electrical system 2 further includes a current sensor 18 structured to sense a fault current 19 at the incoming of electrical enclosure 16 of at least a predetermined magnitude flowing in the second power bus 6 and responsively output a first logical signal 20. A number of light sensors 22 (two example light sensors 22 are shown, although any suitable quantity can be employed) are structured to sense an arc flash (e.g., arc flash 24 of FIG. 1) operatively associated with a number of the second power bus 6 and the third power bus 8 and responsively output a second logical signal 26.

Second circuit interrupter 12 is a circuit interrupter that is structured to interrupt the flow of current therethrough in air. Suitable examples of mechanisms which may be employed as second circuit interrupter 12 include, without limitation, power circuit breakers, molded case circuit breakers, insulated case circuit breakers, load breaking switches. In contrast, circuit interrupters that that are structured to interrupt the flow of current therethough in a vacuum or oil are not suitable for use as second interrupter 12. Second circuit interrupter 12 is structured to produce a third logic signal 28, also referred to herein as a blocking signal or blocking input, whenever second circuit interrupter is about to clear a fault. Such logic signal 28 may originate from one or more of a plurality of sources, e.g., without limitation: a protective relay of second circuit interrupter 12; an auxiliary contact of second circuit interrupter 12; any device monitoring the trip shaft of second circuit interrupter 12; the trip actuator of second circuit interrupter 12; or any similar device.

A circuit 30 is structured to invert the third logical signal 28 to provide a fourth logical signal 32, and to operate at least one of the shorting device 14 and the first circuit interrupter 10 responsive to a logical AND, such as is provided by an example three-input AND gate 33, of the first logical signal 20, the second logical signal 26 and the fourth logical signal 32. The three-input AND gate 33 has an output 34 to operate at least one of the shorting device 14 and the first circuit interrupter 10 or a plurality of circuit interrupters outside of enclosure 16.

The example third power bus 8 can comprise any, some or all of a number of power busses (not shown), a number of power conductors (not shown), a number of power cables (not shown), and/or a number of loads (not shown), such as equipment (not shown) electrically connected external to enclosure 13 housing the second circuit interrupter 12 on the "third power bus side" (e.g., to the right with respect to FIG. 1) of the second circuit interrupter 12.

The example current sensor 18 (e.g., without limitation, a current transformer (CT); current sensor, a Rogowski coil; a Rogowski sensor) is structured to sense the fault current 19 and output the first logical signal 20 when the sensed fault current exceeds a predetermined magnitude. For example and without limitation, a current threshold of about two times the nominal CT rating can be employed. For example, this ensures that light sensing does not activate the shorting device 14 and/or the first circuit interrupter 10 due to normal or rated load current. Alternatively, any suitable current threshold can be employed.

Figure 2:
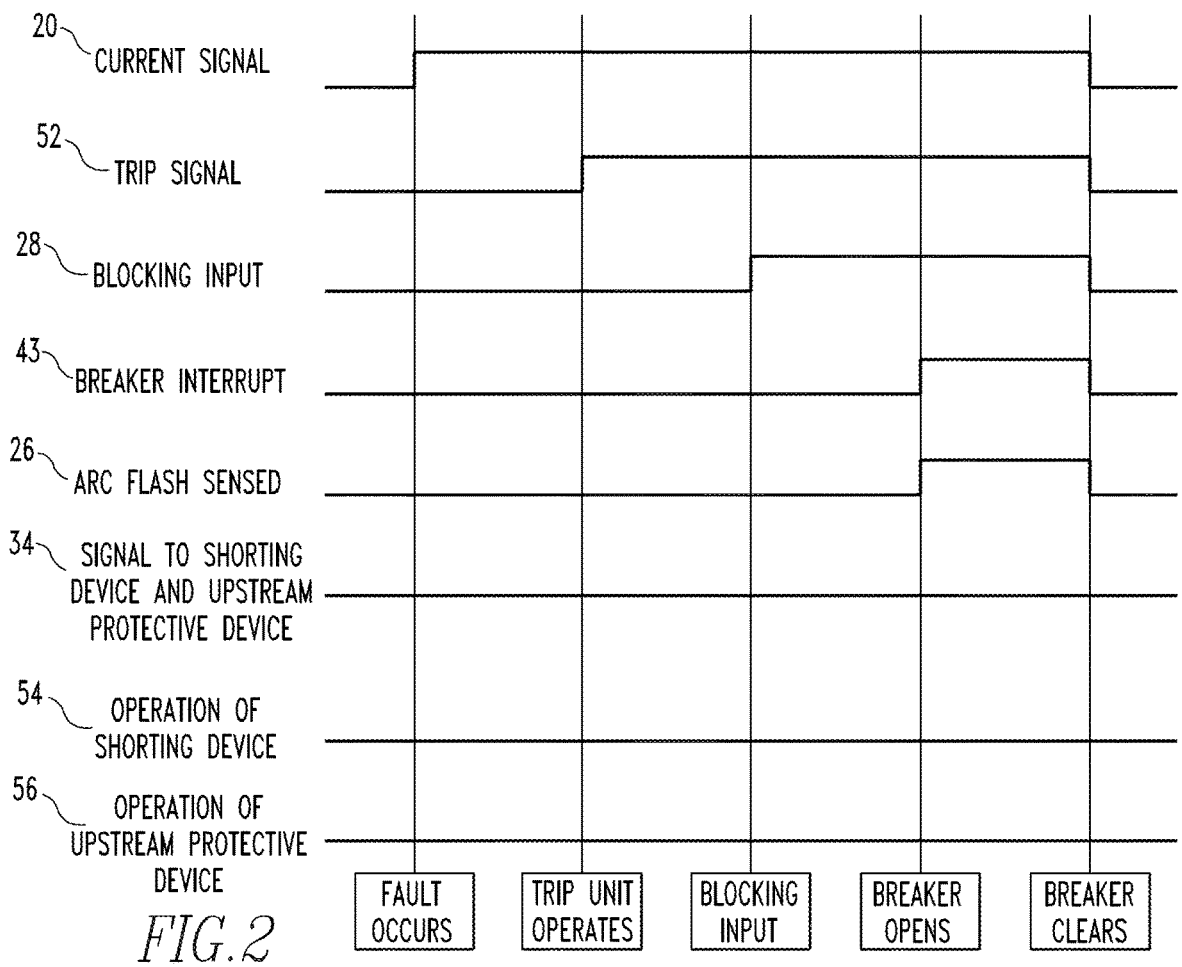
FIG. 2 includes plots of various signals versus time for the arc flash detection apparatus of FIG. 1.

In FIG. 2, the first logical (current) signal 20 is output by the current sensor 18, which senses primary current flow, such as the fault current 19 being of at least the predetermined magnitude flowing in the second power bus 6. In the case of an internal fault, such as fault 40 shown in FIG. 3, the resulting light 42 and fault current 19 occur essentially simultaneously. Conversely, for an external fault, such as fault 44 shown in FIG. 1, fault current 19 flows for a relatively long period of time, as can be seen between the leading edges of the signals 20 and 26 of FIG. 2, prior to the arc flash 24 from arc chutes (not shown) being generated from interruption of the fault current 19 by the second circuit interrupter 12.

The disclosed concept need not operate a circuit interrupter, such as the first circuit interrupter 10, and can advantageously prevent the nuisance operation thereof, since the second circuit interrupter 12 is permitted to interrupt the external fault 44 (FIG. 1), as shown in FIG. 2, without operation of the shorting device 14 that would otherwise cause the first circuit interrupter 10 to open. As shown in FIGS. 1 and 2, the second circuit interrupter 12 trips open, and in doing so, produces the arc flash 24 under normal operating conditions without operating the shorting device 14.

Figure 3:
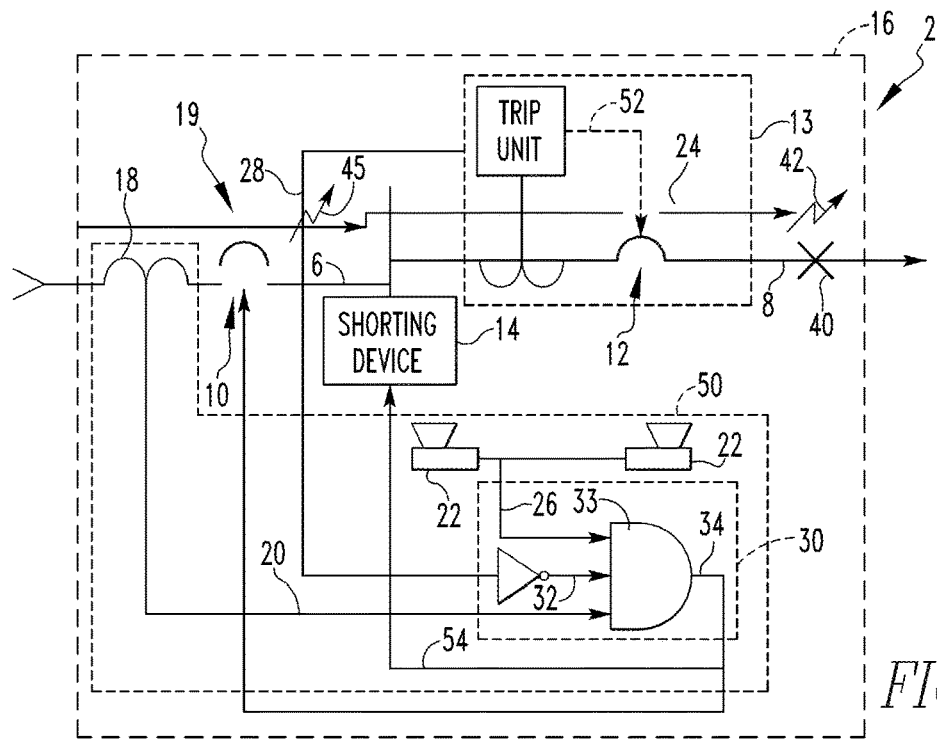
FIG. 3 is a block diagram in schematic form of the arc flash detection apparatus of FIG. 1, except with a fault inside of the equipment housing on the feeder load side power bus in accordance with an embodiment of the disclosed concept.
Figure 4:
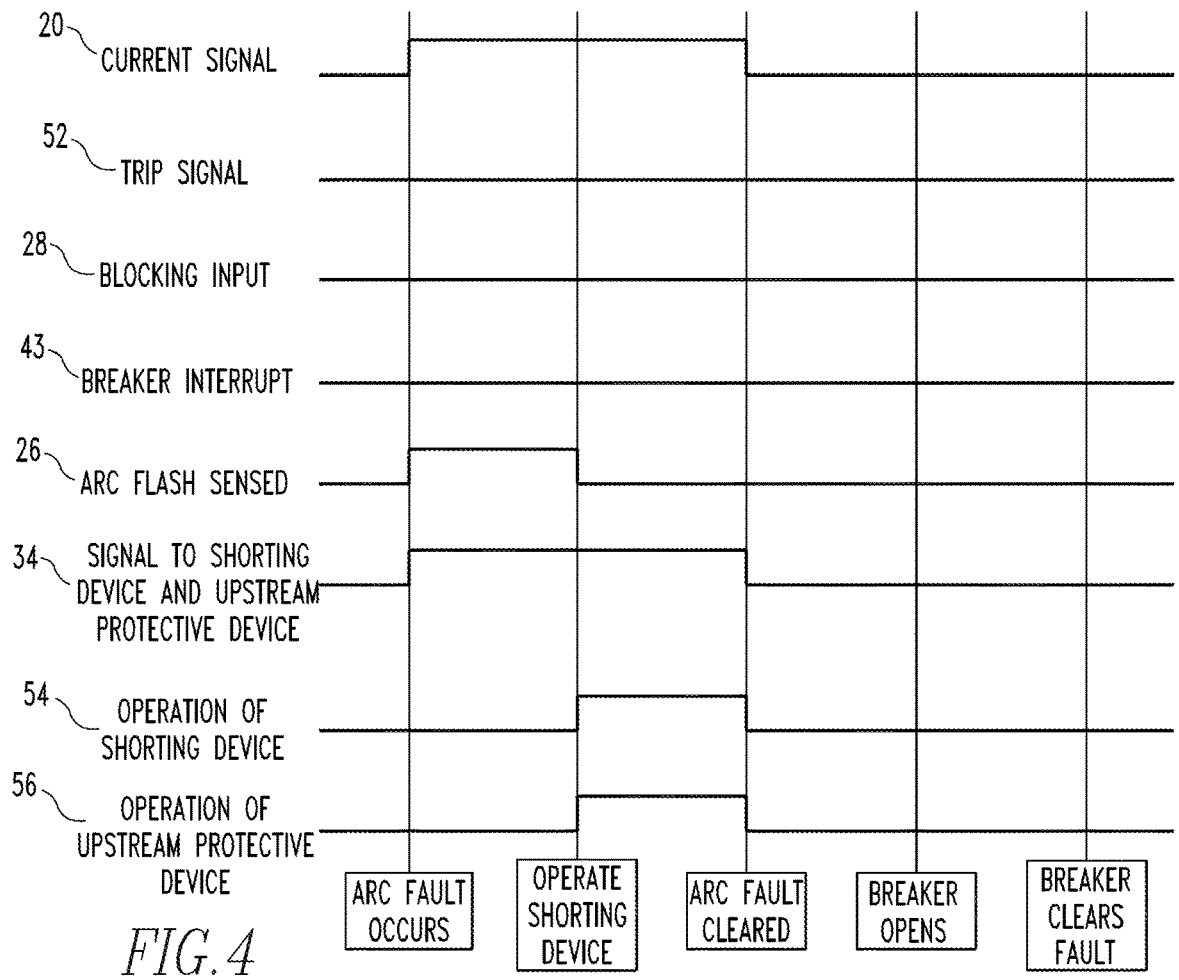
FIG. 4 includes plots of various signals versus time for the arc flash detection apparatus of FIG. 3.

Conversely, as shown in FIGS. 3 and 4, an internal fault 40 (and associated arc flash 42) causes operation of the shorting device 14 that, in turn, causes the first circuit interrupter 10 to open (and subsequent arc flash 45 to occur).

Alternatively, the disclosed concept need not employ or operate the shorting device 14. Here, when output 34 of the three-input AND gate 32 is true, this causes a contact (not shown) to close, actuate the shorting device 14 and, thus, trip open the first circuit interrupter 10. As has been discussed, each of the shorting device 14, which is actuated by the three-input AND gate output 34, and the first circuit interrupter 10 can be separately employed or can be employed together in combination.

The example circuit 30 can be any suitable analog and/or digital circuit, such as a hardware circuit and/or a processor-based (e.g., hardware and software/firmware) circuit. For example and without limitation, this could be a combination of digital and analog technology with embedded firmware. In an example embodiment, circuit 30 is an arc fault relay.

As can be seen from FIGS. 4 and 2, the circuit 30 can operate the shorting device 14 for the internal fault 40 (and resulting arc flash 42 in FIG. 3) on the second power bus 6, but it does not operate the shorting device 14 for the external fault 44 (FIG. 1) on the third power bus 8 or for the arc flash 24 from arc chutes (not shown) being generated from interruption of the fault current 19 by the second circuit interrupter 12 when protecting against such external fault 44. The circuit 30, the current sensor 18 and the number of light sensors 22 provide an arc flash detection apparatus 50 for the electrical system 2.

FIG. 2 shows the current signal 20 output by the current sensor 18, an internal trip signal 52 of the second circuit interrupter 12, and the blocking input signal 28. The breaker interrupt signal 43 (which occurs mechanically within the breaker and thus is not shown in FIG. 1) shows the timing of the interruption of the fault current 19 by the second circuit interrupter 12. The signal 26 shows the timing of the sensing of the arc flash 24 from the arc chutes (not shown) of the second interrupter 12. The arc flash 24 is generated from interruption of the fault current 19 by the second circuit interrupter 12. Signals 54 and 56 show that there is no signal to the shorting device 14 (or the first circuit interrupter 10), and that there is no operation of the same, since the output of three-input AND gate 33 is always false (since signal 32 is false when signal 28 is true, i.e., when second circuit interrupter 12 is moving to an open position).

FIG. 4 shows that there is no internal trip signal 52, no circuit breaker interrupt signal and no interruption of the fault current 19 by the second circuit interrupter 12 as fault interruption happens at first circuit interrupter 10, since there is only the internal fault 40 (and resulting arc flash 42 in FIG. 3). Here, unlike FIG. 2, the signal 26 follows the current signal 20, since there is the internal fault 40 (and resulting arc flash 42 in FIG. 3). Signal 34 shows that there is the signal 54 to the shorting device 14, since the output 34 of three-input AND gate 33 is true when the three input signals, i.e., signals 26, 32 (i.e., signal 28 is false thus 32 is true) and 20 is true.

Figure 5:
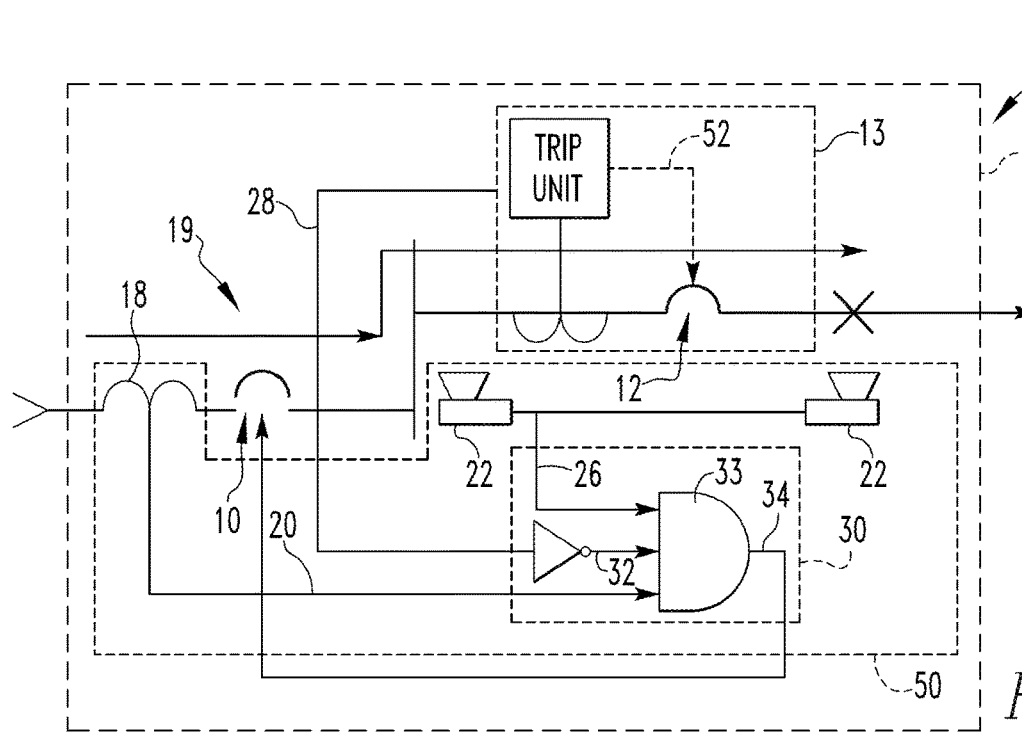
FIG. 5 is a block diagram in schematic form of an arc flash detection apparatus for use with switchgear comprising source service, main and feeder load side power buses, main and feeder circuit breakers, without a shorting device on the main power bus, with a fault inside of the equipment housing on the feeder load side power bus in accordance with another embodiment of the disclosed concept.
Figure 6:
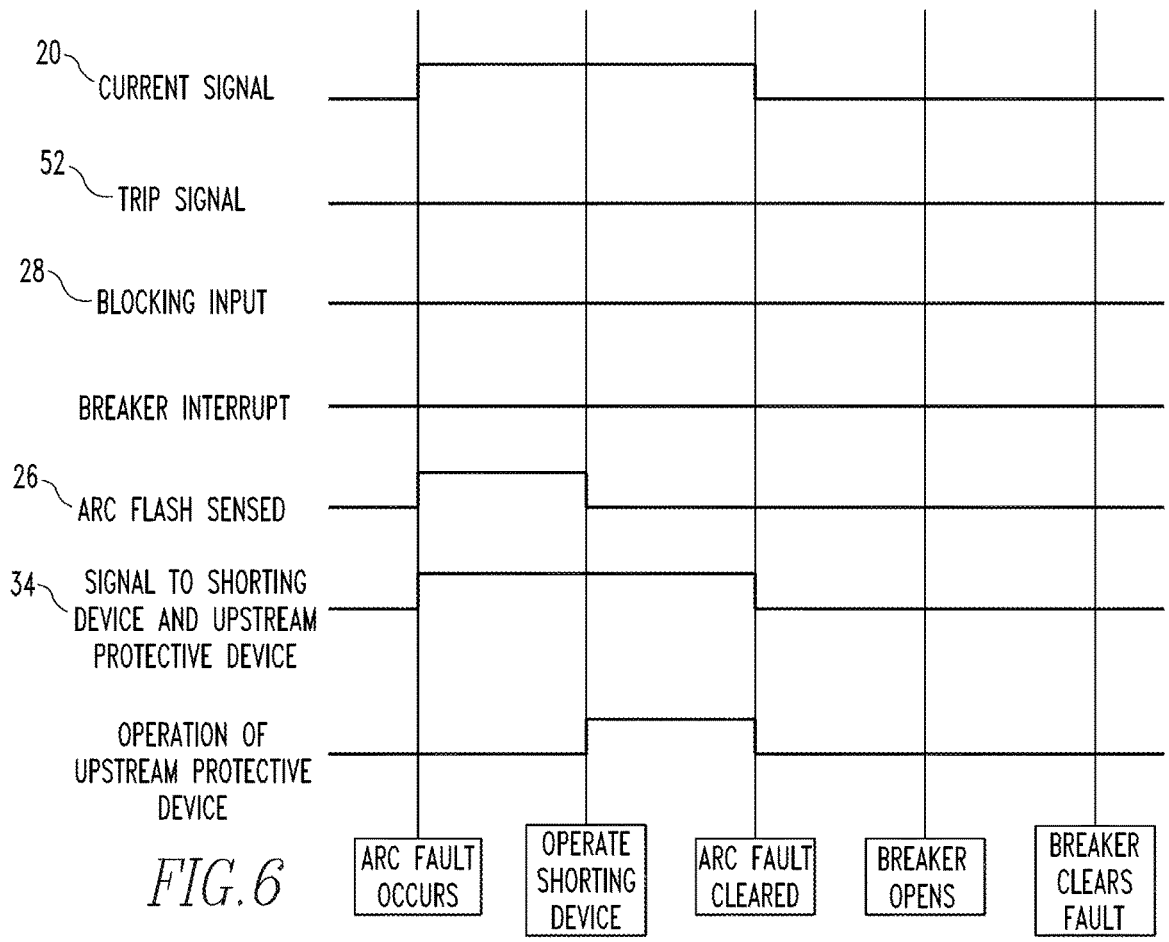
FIG. 6 includes plots of various signals versus time for the arc flash detection apparatus of FIG. 5.

Referring to FIG. 5, an electrical system 2' is similar to the electrical system 2 of FIG. 1, except that there is no shorting device, such as shorting device 14 of electrical system 2 shown in FIGS. 1 and 3. FIG. 6 is similar to FIG. 4, except that there is no operation of a shorting device.

The disclosed concept can be employed in any electrical system that has an upstream circuit interrupter that can open when a local or internal arc flash event occurs. Some non-limiting applications of electrical systems include low voltage or medium voltage switchgear, motor control and switchboards.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical system comprising:
   a first power bus;
   a second power bus;
   a third power bus;
   a first circuit interrupter electrically connected between the first power bus and the second power bus;
   a shorting apparatus operatively associated with the first power bus or second power bus;
   a current sensor structured to sense a fault current of at least a predetermined magnitude flowing in the first power bus and responsively output a first signal;
   a number of light sensors structured to sense an arc flash operatively associated with a number of the first power bus, second power bus and the third power bus and responsively output a second signal;
   a second circuit interrupter electrically connected between the second power bus and the third power bus, the second circuit interrupter being structured to move contacts from a closed position to an open position responsive to detecting an overcurrent condition and responsively output a third signal when the second circuit interrupter is about to clear a fault; and
   a circuit structured to receive the first signal, the second signal, and the third signal and to selectively activate or not activate the shorting apparatus dependent on receiving at least one of the signals,
   wherein the second circuit interrupter comprises an auxiliary contact and wherein the third signal originates from the auxiliary contact.

2. An electrical system comprising:
   a first power bus;
   a second power bus;
   a third power bus;
   a first circuit interrupter electrically connected between the first power bus and the second power bus,
   a shorting apparatus operatively associated with the first power bus or second power bus;
   a current sensor structured to sense a fault current of at least a predetermined magnitude flowing in the first power bus and responsively output a first signal;
   a number of light sensors structured to sense an arc flash operatively associated with a number of the first power bus, second power bus and the third power bus and responsively output a second signal;
   a second circuit interrupter electrically connected between the second power bus and the third power bus, the second circuit interrupter being structured to move contacts from a closed position to an open position responsive to detecting an overcurrent condition and responsively output a third signal when the second circuit interrupter is about to clear a fault; and
   a circuit structured to receive the first signal, the second signal, and the third signal and to selectively activate or not activate the shorting apparatus dependent on receiving at least one of the signals,
   wherein the third signal is produced by a device monitoring one of a trip shaft or a trip actuator of the second circuit interrupter.

3. The electrical system of claim 1, wherein the circuit is configured to activate the at least one of the shorting device or the first circuit interrupter responsive to receiving the first signal and the second signal without having first received the third signal.

4. The electrical system of claim 1, wherein the circuit is configured to activate the shorting apparatus responsive to receiving the second signal without having first received the third signal.

5. A method of operating an arc flash detection system, comprising:
   receiving a blocking signal from a circuit interrupter indicative of movement of the circuit interrupter toward an open position, and
   preventing operation of a shorting device in response to receiving the blocking signal,
   wherein the blocking signal originates from an auxiliary contact associated with the circuit interrupter.

6. A method of operating an arc flash detection system, comprising:
   receiving a blocking signal from a circuit interrupter indicative of movement of the circuit interrupter toward an open position, and
   preventing operation of a shorting device in response to receiving the blocking signal,
   wherein the blocking signal originates from a device monitoring movement of the trip shaft or a trip actuator of the circuit interrupter.

7. A method of operating an arc flash detection system, comprising:
  receiving a blocking signal from a circuit interrupter indicative of movement of the circuit interrupter toward an open position,
  preventing operation of a shorting device in response to receiving the blocking signal, and
  preventing operation of an upstream circuit interrupter in response to the blocking signal.

8. The method of claim 5, further comprising the step of operating the shorting device in response to: receipt of a signal indicative of an overcurrent condition in an electrical system, receipt of a signal indicative of the presence of light in an enclosure of the electrical system, and failure to receive the blocking signal.

9. The method of claim 6, further comprising the step of operating the shorting device in response to: receipt of a signal indicative of an overcurrent condition in an electrical system, receipt of a signal indicative of the presence of light in an enclosure of the electrical system, and failure to receive the blocking signal.

10. The method of claim 7, further comprising the step of operating the shorting device in response to: receipt of a signal indicative of an overcurrent condition in an electrical system, receipt of a signal indicative of the presence of light in an enclosure of the electrical system, and failure to receive the blocking signal.

11. The electrical system of claim 1, wherein the electrical system is disposed within a housing; wherein the third power bus extends out of the housing; and wherein the circuit is structured to operate the shorting apparatus for a fault on the second power bus and for a fault on the third power bus occurring within the housing but is structured to not operate the shorting apparatus for a fault on the third power bus occurring outside of the housing or for an arc generated by the second current interrupter when protecting against the fault on the third power bus occurring outside of the housing.

12. The electrical system of claim 2, wherein the electrical system is disposed within a housing; wherein the third power bus extends out of the housing; and wherein the circuit is structured to operate the shorting apparatus for a fault on the second power bus and for a fault on the third power bus occurring within the housing but is structured to not operate the shorting apparatus for a fault on the third power bus occurring outside of the housing or for an arc generated by the second current interrupter when protecting against the fault on the third power bus occurring outside of the housing.

13. The electrical system of claim 2, wherein the circuit is configured to activate the at least one of the shorting device or the first circuit interrupter responsive to receiving the first signal and the second signal without having first received the third signal.

14. The electrical system of claim 2, wherein the circuit is configured to activate the shorting apparatus responsive to receiving the second signal without having first received the third signal.

* * * * *